United States Patent
Mikami et al.

(10) Patent No.: US 11,683,117 B2
(45) Date of Patent: Jun. 20, 2023

(54) RECEIVING APPARATUS AND DECODING METHOD

(71) Applicant: FUJITSU LIMITED, Kawasaki (JP)

(72) Inventors: Kazumasa Mikami, Yokohama (JP); Junichi Sugiyama, Kawasaki (JP); Takafumi Terahara, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 69 days.

(21) Appl. No.: 17/226,273

(22) Filed: Apr. 9, 2021

(65) Prior Publication Data

US 2021/0409145 A1    Dec. 30, 2021

(30) Foreign Application Priority Data

Jun. 26, 2020 (JP) .............................. JP2020-110518

(51) Int. Cl.
| | |
|---|---|
| *H04B 10/60* | (2013.01) |
| *H04J 14/02* | (2006.01) |
| *H04L 1/00* | (2006.01) |
| *H04B 10/079* | (2013.01) |

(52) U.S. Cl.
CPC .... *H04J 14/0298* (2013.01); *H04B 10/07953* (2013.01); *H04B 10/60* (2013.01); *H04L 1/0053* (2013.01)

(58) Field of Classification Search
CPC ........... H04J 14/0298; H04B 10/07953; H04B 10/60
See application file for complete search history.

(56) References Cited

U.S. PATENT DOCUMENTS

| | | | | |
|---|---|---|---|---|
| 4,949,168 | A  * | 8/1990  | Ninomiya .............. | H03M 1/069 348/E7.005 |
| 6,996,097 | B1 * | 2/2006  | Chou ........................ | H04L 1/06 370/389 |
| 10,911,152 | B2 * | 2/2021  | Hassan ................... | H03M 7/02 |
| 11,018,776 | B2 * | 5/2021  | Hassan .................. | H04B 10/60 |
| 2006/0031737 | A1 * | 2/2006  | Chugg ............... | H03M 13/1185 714/755 |
| 2009/0310493 | A1 * | 12/2009 | Nogami .................. | H04L 1/205 714/751 |
| 2010/0150560 | A1 * | 6/2010  | Lee ..................... | H04B 10/2537 398/79 |
| 2014/0075263 | A1 * | 3/2014  | Ku ..................... | H03M 13/2906 714/755 |
| 2015/0139649 | A1 * | 5/2015  | Kikuchi ............. | H04B 10/5053 398/65 |

(Continued)

FOREIGN PATENT DOCUMENTS

JP    2010-011398 A    1/2010

*Primary Examiner* — Tanya T Motsinger
(74) *Attorney, Agent, or Firm* — Fujitsu Patent Center

(57) ABSTRACT

A decoding method includes: receiving a plurality of subcarrier signals each including encoded data; acquiring a predetermined amount of data from each of the plurality of subcarrier signals; correcting errors in the plurality of subcarrier signals by performing decoding arithmetic processing on the respective predetermined amounts of data acquired from the plurality of subcarrier signals in a time-division manner; and causing the decoding arithmetic processing to be consecutively performed on each of the predetermined amounts of data a predetermined number of times.

14 Claims, 12 Drawing Sheets

(56) References Cited

U.S. PATENT DOCUMENTS

| | | | |
|---|---|---|---|
| 2015/0188637 A1* | 7/2015 | Tanimura | H04J 14/06 |
| | | | 398/184 |
| 2015/0256288 A1* | 9/2015 | Tanaka | H04L 1/0009 |
| | | | 714/776 |
| 2019/0238658 A1* | 8/2019 | Shimizu | H04W 4/46 |
| 2019/0245626 A1 | 8/2019 | Rahn et al. | |
| 2021/0091858 A1* | 3/2021 | Bonetti | H04B 10/5161 |
| 2021/0391943 A1* | 12/2021 | Djordjevic | H04L 1/203 |
| 2021/0409145 A1* | 12/2021 | Mikami | H03M 13/3715 |
| 2022/0123862 A1* | 4/2022 | Zhang | H04L 1/0057 |
| 2022/0222541 A1* | 7/2022 | Matlage | G06N 3/0454 |

* cited by examiner

RECEIVING APPARATUS AND DECODING METHOD

CROSS-REFERENCE TO RELATED APPLICATION

This application is based upon and claims the benefit of priority of the prior Japanese Patent Application No. 2020-110518, filed on Jun. 26, 2020, the entire contents of which are incorporated herein by reference.

FIELD

The embodiments discussed herein are related to a receiving apparatus and a decoding method.

BACKGROUND

Multicarrier transmission enables large-capacity transmission by multiplexing subcarrier signals with low transmission rates of, for example, 20 (Gbps), 50 (Gbps), and the like. Error correction such as soft-decision forward error correction (SD-FEC) or the like is performed on subcarrier signals so as to enable long-distance transmission. Therefore, subcarrier signals are encoded by use of, for example, low-density parity-check (LDPC) codes in a transmitting apparatus.

Regarding error correction, for example, Patent Document 1 discloses that orthogonal frequency division multiplexing (OFDM) data having been received are decoded by iterative operation using turbo codes or the like to perform error correction.

Japanese Laid-open Patent. Publication No. 2010-11398 is disclosed as related art.

In multicarrier transmission, a decoding process is performed for each subcarrier signal. Therefore, decoding processing circuits equal in number to subcarrier signals are provided in a receiving apparatus that receives the subcarrier signals. Thus, as the number of subcarrier signals increases, power to be consumed in the decoding process increases.

In contrast, when each subcarrier signal is decoded by a common decoding circuit, the operating rate of the decoding circuit increases due to a change in the data value of each subcarrier signal as the number of subcarrier signals increases, so that power consumption also increases.

Therefore, an object of the embodiments discussed herein is to provide a receiving apparatus and a decoding method capable of reducing power to be consumed in the process of decoding a plurality of subcarrier signals.

SUMMARY

According to an aspect of the embodiments, a decoding method includes: receiving a plurality of subcarrier signals each including encoded data; acquiring a predetermined amount of data from each of the plurality of subcarrier signals; correcting errors in the plurality of subcarrier signals by performing decoding arithmetic processing on the respective predetermined amounts of data acquired from the plurality of subcarrier signals in a time-division manner; and causing the decoding arithmetic processing to be consecutively performed on each of the predetermined amounts of data a predetermined number of times.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS (Configuration Example of Transmission System)

Figure 1:
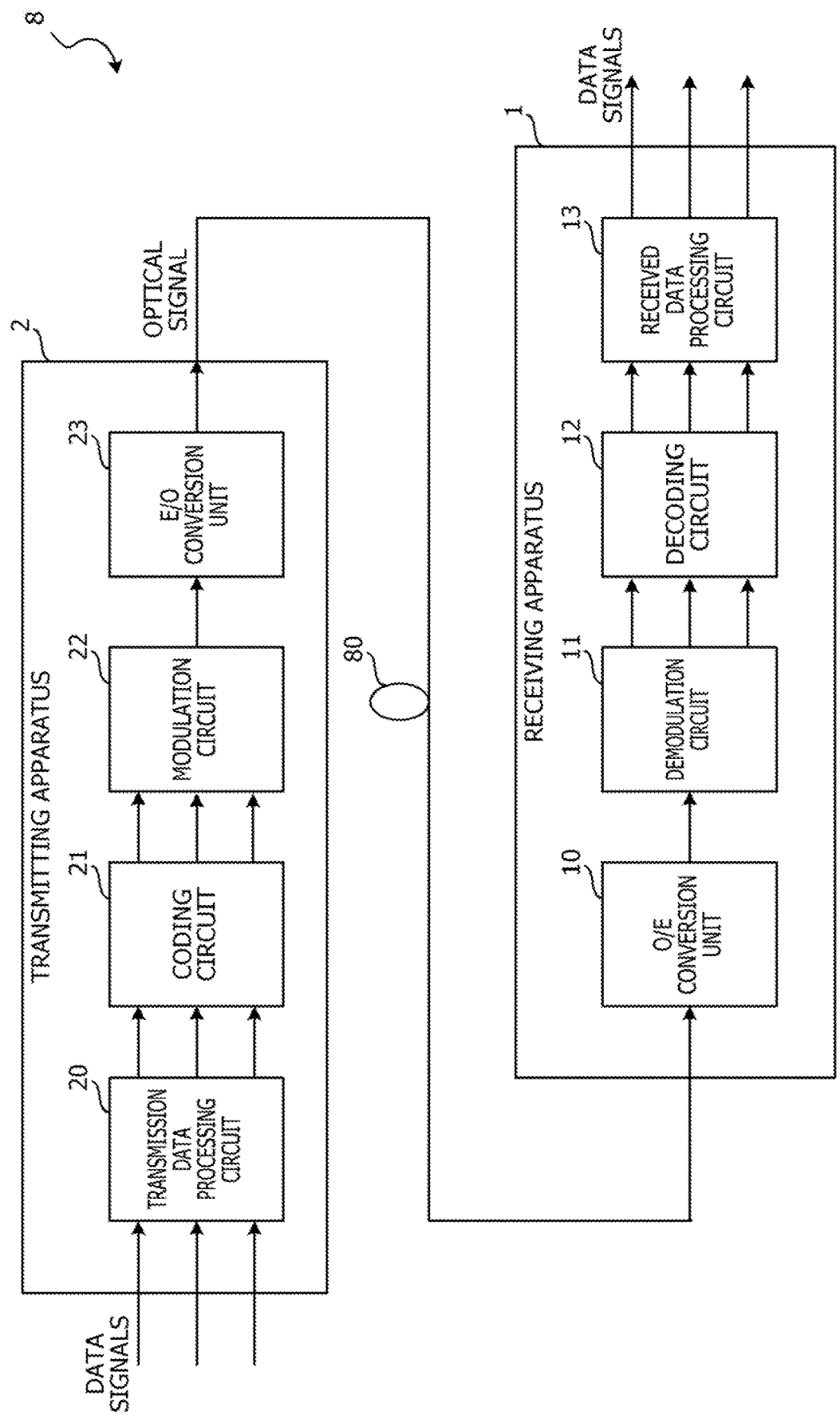
FIG. 1 is a configuration diagram illustrating an example of a transmission system 8.

FIG. 1 is a configuration diagram illustrating an example of a transmission system 8. The transmission system 8 includes a receiving apparatus 1 and a transmitting apparatus 2. The receiving apparatus 1 receives an optical signal. The transmitting apparatus 2 transmits the optical signal. The transmitting apparatus 2 and the receiving apparatus 1 are connected to each other via a transmission line 80 such as an optical fiber. An optical signal is transmitted from the transmitting apparatus 2 through the transmission line 80 to reach the receiving apparatus 1.

The transmitting apparatus 2 transmits an optical signal by multicarrier transmission. The transmitting apparatus 2 includes a transmission data processing circuit 20, a coding circuit 21, a modulation circuit 22, and an electrical/optical (E/O) conversion unit 23. The transmission data processing circuit 20, the coding circuit 21, and the modulation circuit 22 are, for example, circuits including hardware such as a field-programmable gate array (FPGA), an application-specific integrated circuit (ASIC), and a digital signal processor (DSP). Furthermore, the E/O conversion unit 23 includes an optical modulator, a laser diode, and the like.

A plurality of data signals is input to the transmission data processing circuit 20 from a network on a client side. The case where three data signals are input is cited in the present example, but the number of data signals is not limited to three. The transmission data processing circuit 20 performs frame processing of each data signal, and outputs each data signal to the coding circuit 21.

The coding circuit 21 individually encodes data included in each data signal by using low-density parity-check (LDPC) codes. As a result, the transmission system 8 can correct errors in the data signals by soft-decision forward error correction (SD-FEC), Note that the error correction is not limited to SD-FEC, and may be performed by hard-decision forward error correction (HD-FEC). The coding circuit 21 outputs each data signal to the modulation circuit 22.

The modulation circuit 22 modulates each data signal on a subcarrier of individual frequency according to a multicarrier modulation method. Examples of the multicarrier modulation method include, but are not limited to, quadrature amplitude modulation, orthogonal frequency division multiplexing, and the like. The modulation circuit 22 performs multicarrier modulation on each data signal to generate a single multicarrier signal in which the data signals are multiplexed, and outputs the multicarrier signal to the E/O conversion unit 23. Note that each data signal is an example of a subcarrier signal.

The E/O conversion unit 23 converts the multicarrier signal, which is an electric signal, into an optical signal and outputs the optical signal to the transmission line 80. The E/O conversion unit 23 generates the optical signal by performing optical modulation of laser diode light with the multicarrier signal. The optical signal is input to the receiving apparatus 1 from the transmission line 80.

The receiving apparatus 1 receives the optical signal from the transmitting apparatus 2. The receiving apparatus 1 includes an optical/electrical (O/E) conversion unit 10, a demodulation circuit 11, a decoding circuit 12, and a received data processing circuit 13. The demodulation circuit 11, the decoding circuit 12, and the received data processing circuit 13 are, for example, circuits including hardware such as an FPGA, an ASIC, and a DSP. Furthermore, the O/E conversion unit 10 includes a photodiode or the like. Note that the operation of the receiving apparatus 1 to be described below is an example of a decoding method.

The O/E conversion unit 10 receives the optical signal input from the transmission line 80, and converts the optical signal into an electric multicarrier signal with, for example, a photodiode. The multicarrier signal is input from the O/E conversion unit 10 to the demodulation circuit 11. Note that the O/E conversion unit 10 is an example of a receiving unit that receives a plurality of subcarrier signals.

The demodulation circuit 11 reproduces each data signal from the multicarrier signal by demodulating the multicarrier signal. The demodulation circuit 11 outputs each data signal to the decoding circuit 12.

The decoding circuit 12 decodes data included in each data signal, and corrects an error in each data signal. Note that details of the decoding circuit 12 will be described below. The decoding circuit 12 outputs each data signal, for which data have been decoded, to the received data processing circuit 13.

The received data processing circuit 13 performs frame processing of each data signal, and transmits each data signal to the network on the client side.

First Embodiment

Figure 2:
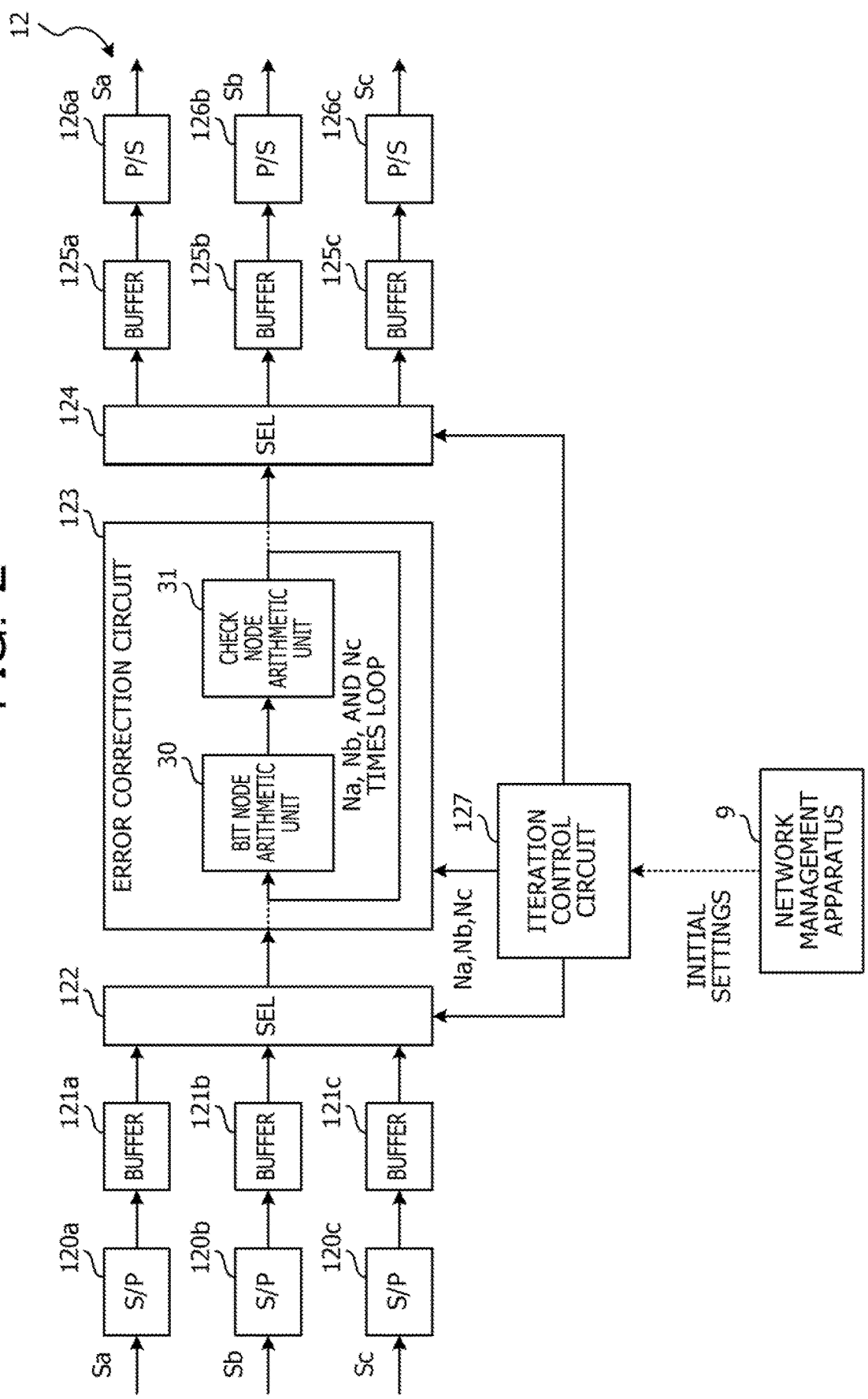
FIG. 2 is a configuration diagram illustrating a decoding circuit of a first embodiment.

FIG. 2 is a configuration diagram illustrating the decoding circuit 12 of a first embodiment. The decoding circuit 12 includes serial-parallel (S/P) conversion units 120a to 120c, buffers 121a to 121c and 125a to 125c, selectors (SELs) 122 and 124, an error correction circuit 123, parallel-serial (P/S) conversion units 126a to 126c, and an iteration control circuit 127.

Data signals Sa, Sb, and Sc are input to the decoding circuit 12 from the demodulation circuit 11. The S/P conversion units 120a to 120c convert data of the data signals Sa to Sc from serial data to parallel data, and output the parallel data to the buffers 121a to 121c, respectively.

The buffers 121a to 121c sequentially acquire and store data from the data signals Sa to Sc for every predetermined number of bits, respectively. For example, the buffers 121a to 121c store data from the data signals Sa to Sc, respectively, for every predetermined number of bits on a time-series basis. In this case, the S/P conversion units 120a to 120c output parallel data of the predetermined number of bits to the buffers 121a to 121c, respectively. Note that the respective data of the predetermined number of bits acquired from the data signals Sa to Sc are referred to as "data blocks" in the following description.

The buffers 121a to 121c output the stored data blocks to the SEL 122, and then store new data blocks. Note that the buffers 121a to 121c are examples of a plurality of acquisition units that acquires data blocks from the plurality of subcarrier signals Sa to Sc, respectively.

The SEL 122 selects one of the buffers 121a to 121c according to an instruction from the iteration control circuit 127. Then, the SEL 122 reads a data block stored in the selected one of the buffers 121a to 121c, and outputs the data block to the error correction circuit 123. The SEL 122 is an example of a selection unit that selects a data block to be subjected to decoding arithmetic processing performed by the error correction circuit 123, from among the respective data blocks acquired by the buffers 121a to 121c.

The error correction circuit 123 is an example of an error correction unit, and corrects errors in the data signals Sa to Sc by performing decoding arithmetic processing on the data block input from SEL 122 in a time-division manner. The error correction circuit 123 includes a bit node arithmetic unit 30 and a check node arithmetic unit 31 that perform the decoding arithmetic processing for each data block.

The bit node arithmetic unit 30 performs arithmetic processing for each bit node of a Tanner graph in an LDPC decoding algorithm (for example, a probability propagation algorithm). The check node arithmetic unit 31 performs arithmetic processing for each check node of the Tanner graph. The bit node arithmetic unit 30 and the check node arithmetic unit 31 alternately perform arithmetic processing on the data block to enhance the reliability of a value.

Under the control of the iteration control circuit 127, the bit node arithmetic unit 30 and the check node arithmetic unit 31 consecutively perform arithmetic processing on the data blocks of the data signals Sa to Sc predetermined numbers of times Na to Nc, respectively.

When the data block of the subcarrier signal Sa is input to the error correction circuit 123, the iteration control circuit 127 instructs the bit node arithmetic unit 30 and the check node arithmetic unit 31 to alternately perform arithmetic processing Na times each. As a result, the calculated value loops Na times between the bit node arithmetic unit 30 and the check node arithmetic unit 31.

Furthermore, when the data block of the subcarrier signal Sb is input to the error correction circuit 123, the iteration control circuit 127 instructs the bit node arithmetic unit 30 and the check node arithmetic unit 31 to alternately perform arithmetic processing Nb times each. As a result, the calculated value loops Nb times between the bit node arithmetic unit 30 and the check node arithmetic unit 31.

Furthermore, when the data block of the subcarrier signal Sc is input to the error correction circuit 123, the iteration control circuit 127 instructs the bit node arithmetic unit 30 and the check node arithmetic unit 31 to alternately perform arithmetic processing Nc times each. As a result, the calculated value loops Nc times between the bit node arithmetic unit 30 and the check node arithmetic unit 31.

The error correction circuit 123 corrects errors in the data signals Sa to Sc by performing decoding arithmetic processing the predetermined numbers of times Na to Nc, respectively. As the predetermined numbers of times Na to Nc increase, the values of the respective data blocks of the data signals Sa to Sc converge to correct values, so that the bit error rates of the data signals Sa to Sc decrease.

The error correction circuit 123 sequentially outputs the error-corrected data blocks to SEL 124. The SEL 124 selects one of the buffers 125a to 125c according to an instruction from the iteration control circuit 127, and outputs the data block to the selected one of the buffers 125a to 125c.

The buffers 125a to 125c store the data blocks input from the SEL 124, and output the data blocks to the P/S conversion units 126a to 126c, respectively. The P/S conversion units 126a to 126c convert the data blocks respectively input from the buffers 125a to 125c from parallel data to serial data, and output the serial data to the received data processing circuit 13.

The iteration control circuit 127 controls iteration (repetition) of the arithmetic processing that the error correction circuit 123 performs. A network management apparatus 9, which is externally located, configures initial settings for the decoding of the data signals Sa to Sc, on the iteration control circuit 127. The initial settings also include the predetermined numbers of times Na to Nc the decoding arithmetic processing is performed on the data blocks of the data signals Sa to Sc, respectively. The iteration control circuit 127 acquires the predetermined numbers of times Na to Nc from the network management apparatus 9.

An upper limit number of times Nmax arithmetic processing can be performed within a predetermined time period T is determined depending on the processing capacity of the error correction circuit 123. Therefore, the network management apparatus 9 determines the predetermined numbers of times Na to Nc such that the sum of the predetermined numbers of times Na to Nc is equal to or less than the upper limit number of times Nmax.

The iteration control circuit 127 switches selections made by the SEL 122 according to time to be taken to perform the decoding arithmetic processing the predetermined numbers of times Na to Nc. For example, assuming that Ta denotes time to be taken to perform the decoding arithmetic processing the predetermined number of times Na, the iteration control circuit 127 causes the SEL 122 to select the buffer 121a for storing the data block of the data signal Sa, and waits until the time Ta to be taken for the decoding arithmetic processing elapses. After the elapse of the time Ta, the iteration control circuit 127 causes the SEL 122 to select the buffer 121b. Therefore, the error correction circuit 123 does not need to manage the timing of data block input for each of the data signals Sa to Sc.

Furthermore, as in the case of the SEL 122, the iteration control circuit 127 also switches selections made by the SEL 124 according to time to be taken to perform the decoding arithmetic processing the predetermined numbers of times Na to Nc. Therefore, the error correction circuit 123 does not need to manage the timing of data block output for each of the data signals Sa to Sc.

Furthermore, the iteration control circuit 127 controls iteration of the decoding arithmetic processing that the error correction circuit 123 performs, as shown in the following example.

Figure 3:
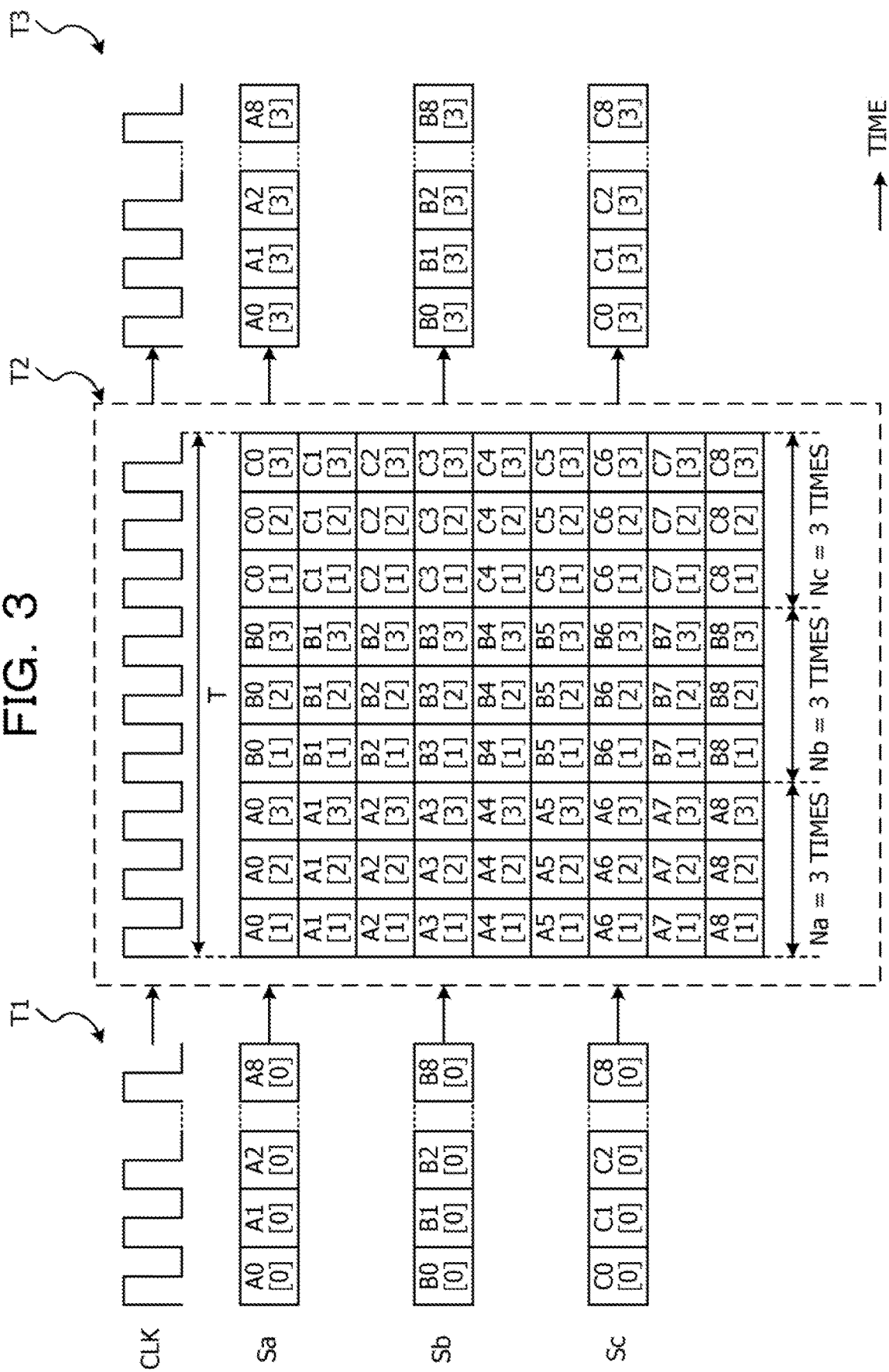
FIG. 3 is a timing chart illustrating an example of iteration control.

FIG. 3 is a timing chart illustrating an example of iteration control. The reference numeral T1 denotes data blocks A0[0] to A8[0], B0[0] to B8[0], and C0[0] to C8[0] of the data signals Sa to Sc to be input to the error correction circuit 123 together with a clock signal CLK.

Here, each Ai[0]=0, 1, . . . , 8) of the data blocks A0[0] to A8[0] of the data signal Sa is a piece of data for one clock during parallel transmission. Furthermore, each Bi[0] of the data blocks B0[0] to B8[0] of the data signal Sb is a piece of data for one clock during parallel transmission. Each Ci[0] of the data blocks C0[0] to C8[0] of the data signal Sc is a piece of data for one clock during parallel transmission.

The data blocks A0[0] to A8[0], B0[0] to B8[0], and C0[0] to C8[0] are input to the error correction circuit 123 for each clock of the clock signal CLK.

Note that the data blocks A0[0] to A8[0], B0[0] to B8[0], and C0[0] to C8[0] are input to the error correction circuit 123 according to the order of arithmetic processing to be performed in the error correction circuit 123, by the switching of selections made by the SEL 122.

The reference numeral T2 denotes data blocks A0[j] to A8[j], B0[j] to B8[j], and C0[j] to C8[j] (j=1, 2, 3) to be subjected to arithmetic processing performed in synchronization with the clock signal CLK in the error correction circuit 123 during the time period T. The present example is based on the assumption that the upper limit number of times Nmax is set to 9, and the predetermined numbers of times Na to Nc are each set to 3.

Therefore, the iteration control circuit 127 controls the error correction circuit 123 such that the error correction circuit 123 performs each arithmetic processing on the data block of each of the data signals Sa to Sc three consecutive times. it is assumed that arithmetic processing to be performed at a time is completed in one clock of the clock signal CLK. The error correction circuit 123 sequentially performs decoding arithmetic processing on the data blocks A0[j] to A8[j], B0[j] to B8[j], and C0[j] to C8[j] of the data signals Sa to Sc in a time-division manner as follows.

First, the data blocks of the data signal Sa are updated such that the data blocks A0[0] to A8[0] are changed to the data blocks A0[1] to A8[1] by the first arithmetic processing, changed to the data blocks A0[2] to A8[2] by the second arithmetic processing, and changed to the data blocks A0[3] to A8[3] by the third arithmetic processing. Next, the data blocks of the data signal Sb are updated such that the data blocks B0[0] to B8[0] are changed to the data blocks B0[1] to B8[1] by the first arithmetic processing, changed to the data blocks B0[2] to B8[2] by the second arithmetic processing, and changed to the data blocks B0[3] to B8[3] by the third arithmetic processing. Finally, the data blocks of the data signal Sc are updated such that the data blocks C0[0] to C8[0] are changed to the data blocks C0[1] to C8[1] by the first arithmetic processing, changed to the data blocks C0[2] to C8[2] by the second arithmetic processing, and changed to the data blocks C0[3] to C8[3] by the third arithmetic processing.

The reference numeral T3 denotes the data blocks A0[3] to A8[3], B0[3] to B8[3], and C0[3] to C8[3] of the data signals Sa to Sc to be output from the error correction circuit 123 together with the clock signal CLK. The data blocks A0[3] to A8[3], B0[3] to B8[3], and C0[3] to C8[3] are stored in the buffers 125a to 125c, respectively.

In this way, the iteration control circuit 127 causes the error correction circuit 123 to consecutively perform the decoding arithmetic processing the predetermined numbers of times Na to Nc for each data block. Therefore, the iteration control circuit 127 consecutively performs arithmetic processing for each of the data signals Sa to Sc. In the present example, after arithmetic processing is performed on the data block of the data signal Sa three consecutive times, arithmetic processing is performed on the data block of the data signal Sb three consecutive times. Then, arithmetic processing is performed on the data block of the data signal Sc three consecutive times.

The data block of each of the data signals Sa to Sc converges to a correct value each time the arithmetic processing is repeated. Therefore, a change in the value of the data block resulting from the arithmetic processing is reduced as the arithmetic processing is repeated. As a result, the operating rate of the error correction circuit 123 is also reduced, so that power to be consumed in the decoding process is reduced.

Figure 4:
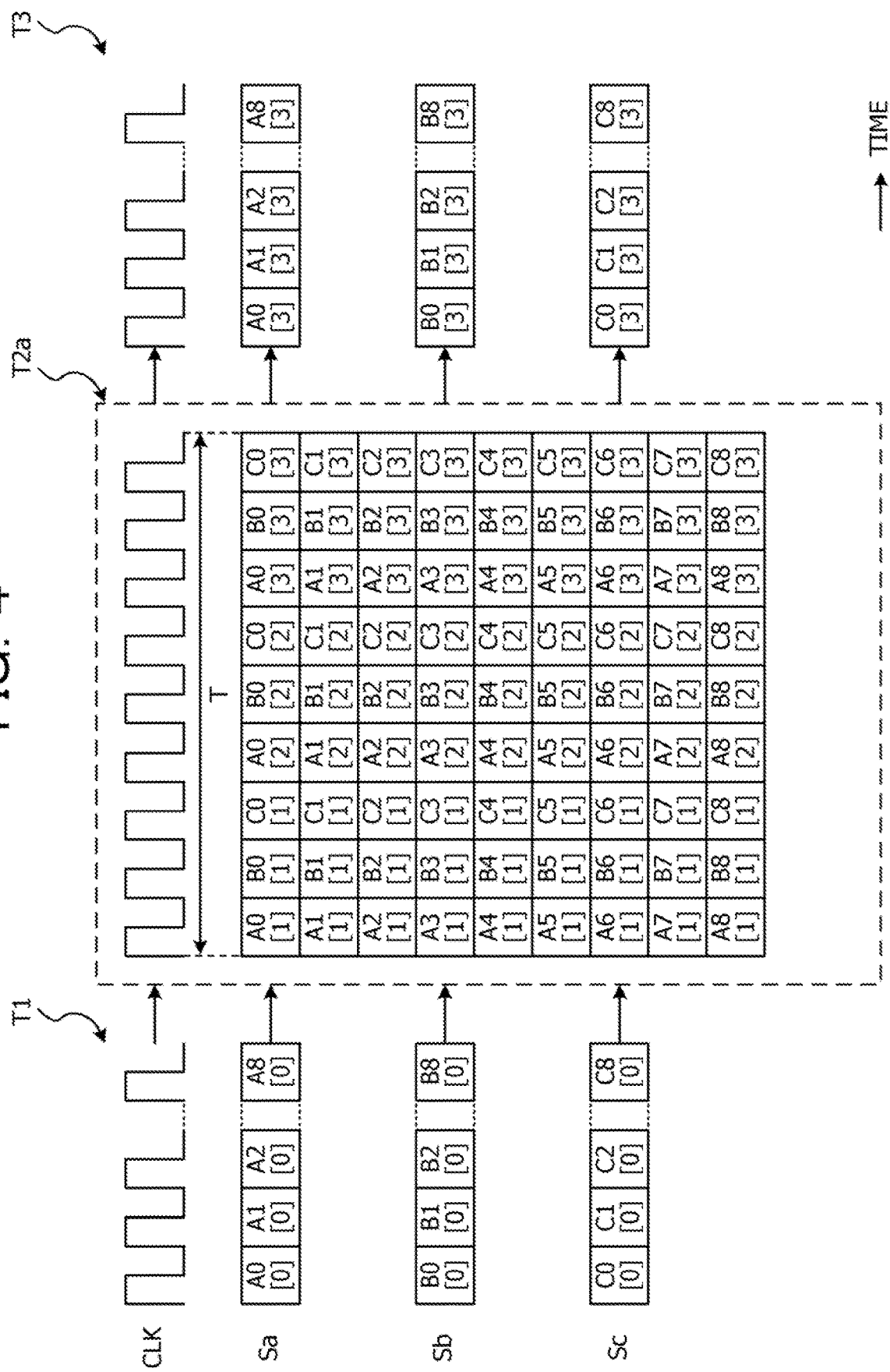
FIG. 4 is a timing chart illustrating a comparative example of iteration control.

FIG. 4 is a timing chart illustrating a comparative example of iteration control. In FIG. 4, the same elements as those in FIG. 3 are denoted by the same reference numerals, and description thereof will be omitted.

The reference numeral T2a denotes data blocks A0[j] to A8[j], B0[j] to B8[j], and C0[j] to C8[j] to be subjected to arithmetic processing performed in synchronization with the clock signal CLIP in the error correction circuit 123 of the comparative example during the time period T. In the comparative example, each time arithmetic processing for the data block of one of the data signals Sa to Sc is completed, a data block to be subjected to the arithmetic processing is switched to the data block of another of the data signals Sa to Sc.

Therefore, unlike the embodiment, the data signals Sa to Sc to be subjected to the decoding arithmetic processing are frequently switched in the present example. Thus, arithmetic processing for the data block of the another of the data signals Sa to Sc is started before the value of the data block of each of the data signals Sa to Sc converges. Accordingly, the operating rate of the error correction circuit 123 is higher than that in the embodiment. Thus, power to be consumed in the decoding process increases as the number of subcarrier signals increases.

(Example of Setting Predetermined Numbers of Times Na to Nc)

In the above example, the network management apparatus 9 sets the respective predetermined numbers of times Na to Nc for each of the data signals Sa to Sc to 3. Meanwhile, the predetermined numbers of times are not limited thereto. The network management apparatus 9 may determine the predetermined numbers of times Na to Nc based on at least either the modulation method or transmission distance of each of the data signals Sa to Sc as in the following example.

Figure 5:
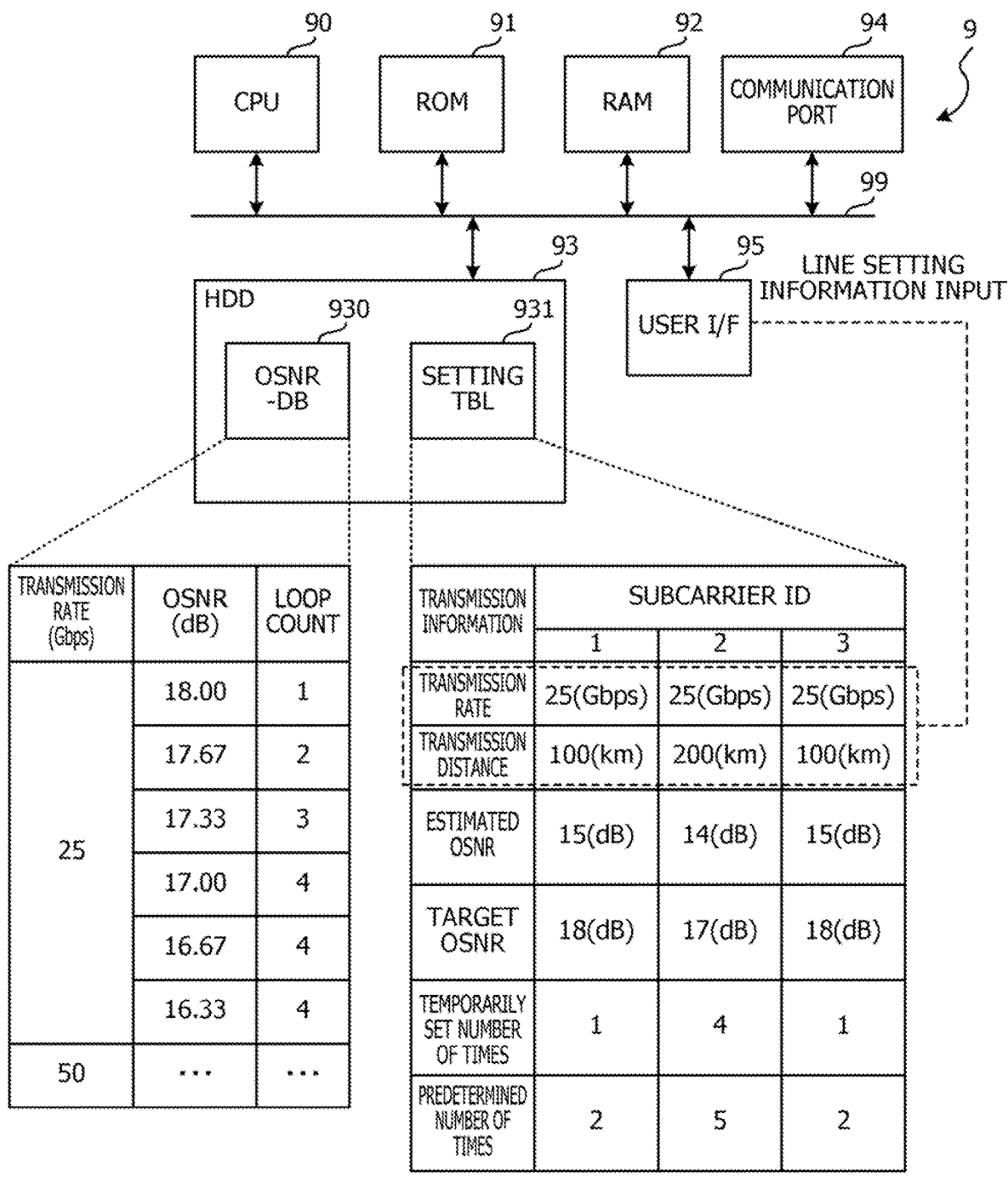
FIG. 5 is a configuration diagram illustrating an example of a network management apparatus.

FIG. 5 is a configuration diagram illustrating an example of the network management apparatus 9. The network management apparatus 9 includes a central processing unit (CPU) 90, a read only memory (ROM) 91, a random access memory (RAM) 92, a hard disk drive (HDD) 93, a communication port 94, and a user interface unit (user I/F) 95. The CPU 90 is connected, via a bus 99, to the ROM 91, the RAM 92, the HDD 93, the communication port 94, and the user I/F 95 so as to enable the CPU 90, the ROM 91, the RAM 92, the HDD 93, the communication port 94, and the user I/F 95 to input/output signals to/from each other.

A program for driving the CPU 90 is stored in the ROM 91. The RAM 92 functions as a working memory of the CPU 90. The communication port 94 processes communication between the iteration control circuit 127 of the receiving apparatus 1 and the CPU 90 via, for example, a local area network (LAN) (not illustrated). The user I/F 95 is connected to, for example, a terminal device of a network administrator (not illustrated), and outputs line setting information input from the terminal device to the CPU 90 via the bus 99. Note that the user I/F 95 includes, for example, an ASIC, an FPGA, or the like.

An optical signal-to-noise ratio (OSNR) database (OSNR-DB) 930 and a setting table (setting TBL) 931 are stored in the HDD 93. Note that the OSNR-DB 930 and the setting TBL 931 may be stored in a non-volatile memory instead of the HDD 93.

The correspondence between the transmission rates (Gbps) and OSNRs (dB) of the data signals Sa to Sc, and the loop counts of arithmetic processing to be performed by the bit node arithmetic unit 30 and the check node arithmetic unit 31 is registered in the OSNR-DB 930 in advance. The transmission rate is calculated from the baud rate of the modulation method for each of the data signals Sa to Sc. Furthermore, the OSNR is calculated from the modulation method and transmission distance of each of the data signals Sa to Sc.

Transmission information for each subcarrier ID is registered in the setting TBL 931. The subcarrier IDs are for identifying the data signals Sa to Sc. The subcarrier IDs of the data signals Sa to Sc are "1", "2", and "3", respectively. The transmission information includes a transmission rate (Gbps), a transmission distance (km), an estimated OSNR (dB), a target OSNR (dB), a temporarily set number of times, and a predetermined number of times for each of the data signals Sa to Sc.

The transmission rate and transmission distance of each of the data signals Sa to Sc are input from the user I/F 95 to the CPU 90 (see dotted line). The CPU 90 registers, in the setting TBL 931, an OSNR estimated from a transmission rate and a transmission distance as an estimated OSNR together with the transmission rate and the transmission distance. Furthermore, the CPU 90 registers a target OSNR, which is the estimated OSNR plus a margin of 3(dB), in the setting TBL 931.

The CPU 90 searches the OSNR-DB 930 for a loop count corresponding to the target OSNR, and registers the found loop count as a temporarily set number of times in the setting TBL 931. For example, in the case of the data signal Sa (subcarrier ID "1") and the data signal Sc (subcarrier ID "3"), the target OSNR is 18 (dB), so that the loop count is 1. Therefore, the number of times temporarily set for each of the subcarrier IDs "1" and "3" is 1.

Furthermore, in the case of the data signal Sb (subcarrier ID "2"), the target OSNR is 17 (dB), so that the loop count is 4. Therefore, the number of times temporarily set for the subcarrier ID "2" is 4.

Furthermore, when the sum of the respective numbers of times temporarily set for the data signals Sa to Sc is less than the upper limit number of times Nmax the error correction circuit 123 performs arithmetic processing, the CPU 90 evenly allocates a remaining number of times to each of the data signals Sa to Sc. In the case of the present example, the sum of the temporarily set numbers of times is 6 (=1+4+1). Accordingly, assuming that the upper limit number of times Nmax is 9, the remaining number of times is 3 (=9−6).

Therefore, the CPU 90 evenly allocates the remaining number of times of 3, that is, allocates 1 (=3/3) to each of the data signals Sa to Sc. As a result, the CPU 90 registers, in the setting TBL 931, 2 (=1+1) as each of the predetermined numbers of times Na and Nc for the data signals Sa and Sc, and 5 (=4+1) as the predetermined number of times Nb for the data signal Sb.

In this way, the CPU 90 determines the respective predetermined numbers of times Na to Nc for the data signals Sa to Sc. The CPU 90 sets the predetermined numbers of times Na to Nc in the iteration control circuit 127 by transmitting the predetermined numbers of times Na to Nc to the receiving apparatus 1 via the communication port 94.

Figure 6:
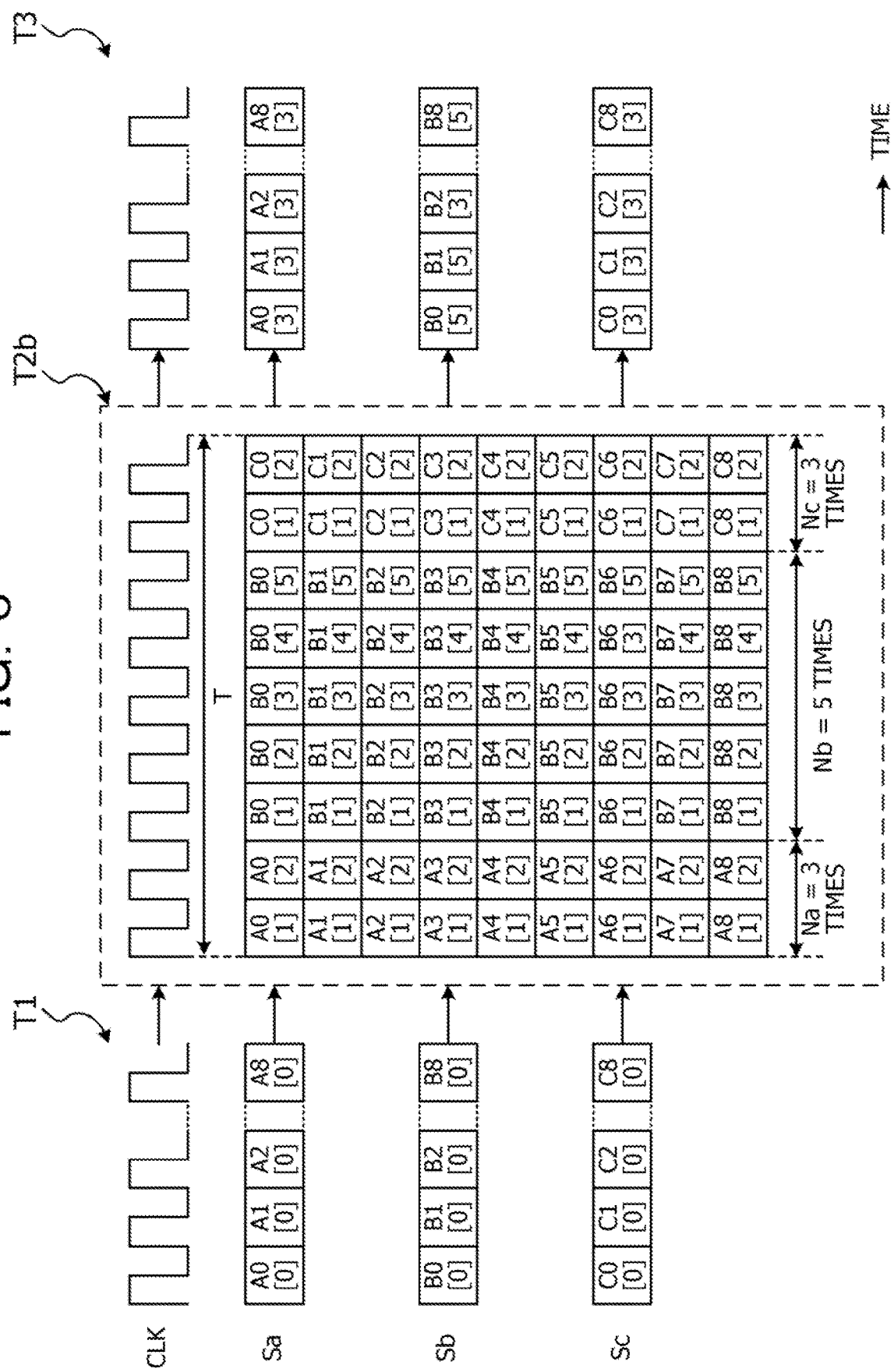
FIG. 6 is a diagram illustrating an example of setting predetermined numbers of times Na to Nc based on transmission rates and transmission distances.

FIG. 6 is a diagram illustrating an example of setting the predetermined numbers of times Na to Nc based on transmission rates and transmission distances. In FIG. 6, the same elements as those in FIG. 3 are denoted by the same reference numerals, and description thereof will be omitted. The reference numeral T2*b* corresponds to the reference numeral T2 in FIG. 3.

The network management apparatus 9 has set 2 as the predetermined numbers of times Na and Nc for the data signals Sa and Sc and 5 as the predetermined number of times Nb for the data signal Sb in the iteration control circuit 127. Therefore, the error correction circuit 123 consecutively performs decoding arithmetic processing on the respective data blocks of the data signals Sa to Sc the predetermined numbers of times Na to Nc, so as to achieve the above target OSNRs according to the transmission rates and the transmission distances. As a result, the transmission characteristics of each of the data signals Sa to Sc are improved.

As in the following example, the iteration control circuit 127 may dynamically change the predetermined numbers of times Na to Nc based on the respective qualities of the data signals Sa to Sc regardless of the initial settings made by the network management apparatus 9. Thus, the receiving apparatus 1 can perform arithmetic processing the predetermined numbers of times Na to Nc that are appropriate numbers determined according to the respective qualities of the data signals Sa to Sc, so that power to be consumed in the decoding process can be more effectively reduced. Note that in the present example, the predetermined numbers of times Na to Nc are each determined based on both the modulation method and the transmission distance, but the predetermined numbers of times Na to Nc may each be determined based on only either the modulation method or the transmission distance.

Second Embodiment

Figure 7:
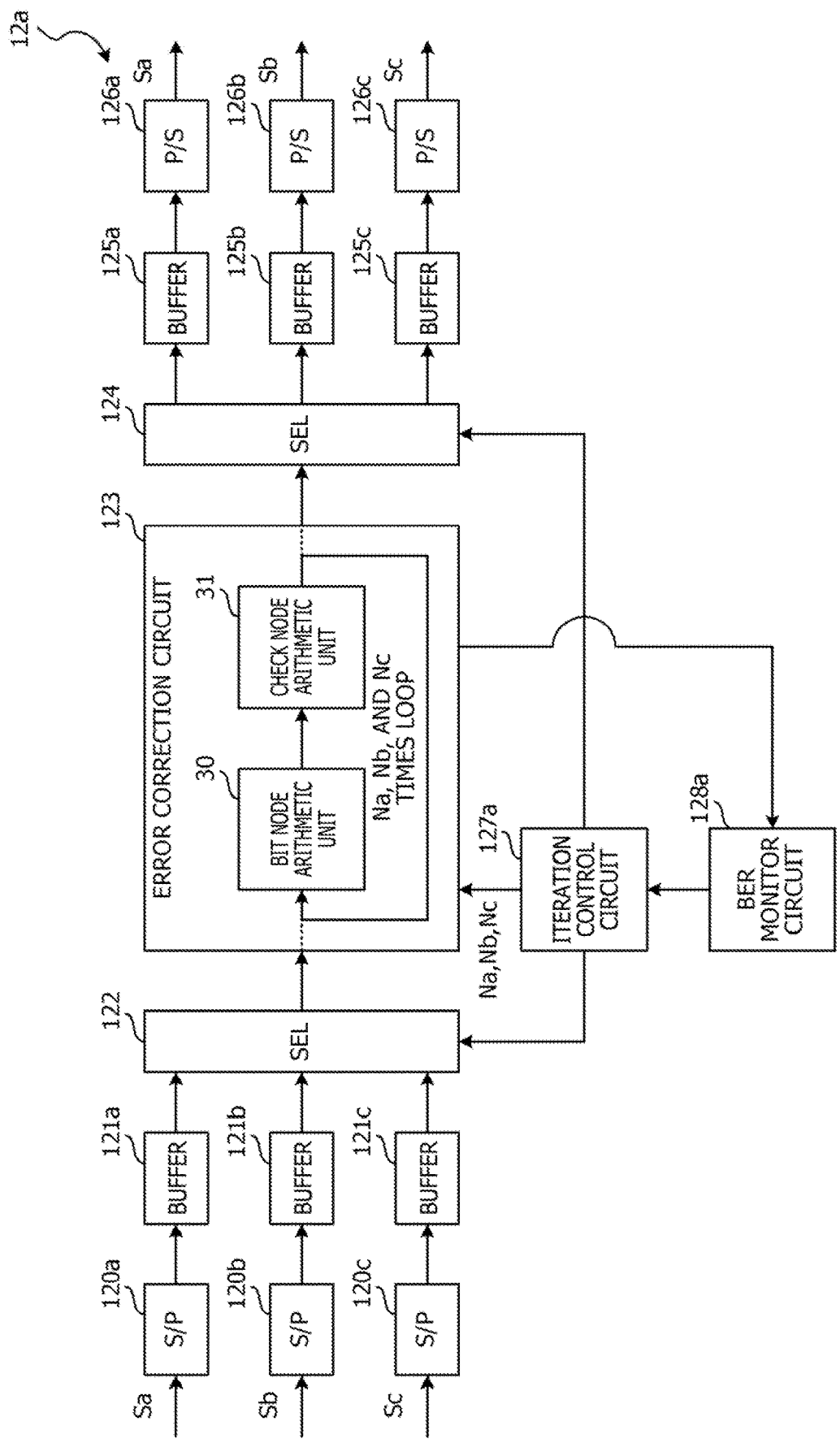
FIG. 7 is a configuration diagram illustrating a decoding circuit of a second embodiment.

FIG. 7 is a configuration diagram illustrating a decoding circuit 12*a* of a second embodiment. In FIG. 7, the same elements as those in FIG. 2 are denoted by the same reference numerals, and description thereof will be omitted. The decoding circuit 12*a* is provided in a receiving apparatus 1 instead of the decoding circuit 12 of the first embodiment. The decoding circuit 12*a* includes an iteration control circuit 127*a* instead of the iteration control circuit 127, and further includes a bit error rate (BER) monitor circuit 128*a*.

The BER monitor circuit 128*a* acquires respective data of data signals Sa to Sc yet to be error-corrected from an error correction circuit 123, and measures the BERs thereof. The BER monitor circuit 128*a* notifies the iteration control circuit 127*a* of the BER of each of the data signals Sa to Sc. Note that the BER monitor circuit 128*a* is an example of a measuring unit that measures the quality of each of the data signals Sa to Sc Furthermore, the BER is an example of an index value of the quality of each of the data signals Sa to Sc.

The iteration control circuit 127*a* compares the BER with a predetermined upper limit value and lower limit value for each of the data signals Sa to Sc, and changes respective predetermined numbers of times Na to Nc for the data signals Sa to Sc based on comparison results. For example, when the BER of any of the data signals Sa to Sc exceeds the upper limit value, the iteration control circuit 127*a* increases corresponding one of the predetermined numbers of times Na to Nc because the error correction capability of the error correction circuit 123 is insufficient. Furthermore, when the BER of any of the data signals Sa to Sc is below the lower limit value, the iteration control circuit 127*a* reduces corresponding one of the predetermined numbers of times Na to Nc because the error correction capability of the error correction circuit 123 is excessive.

Figure 8:
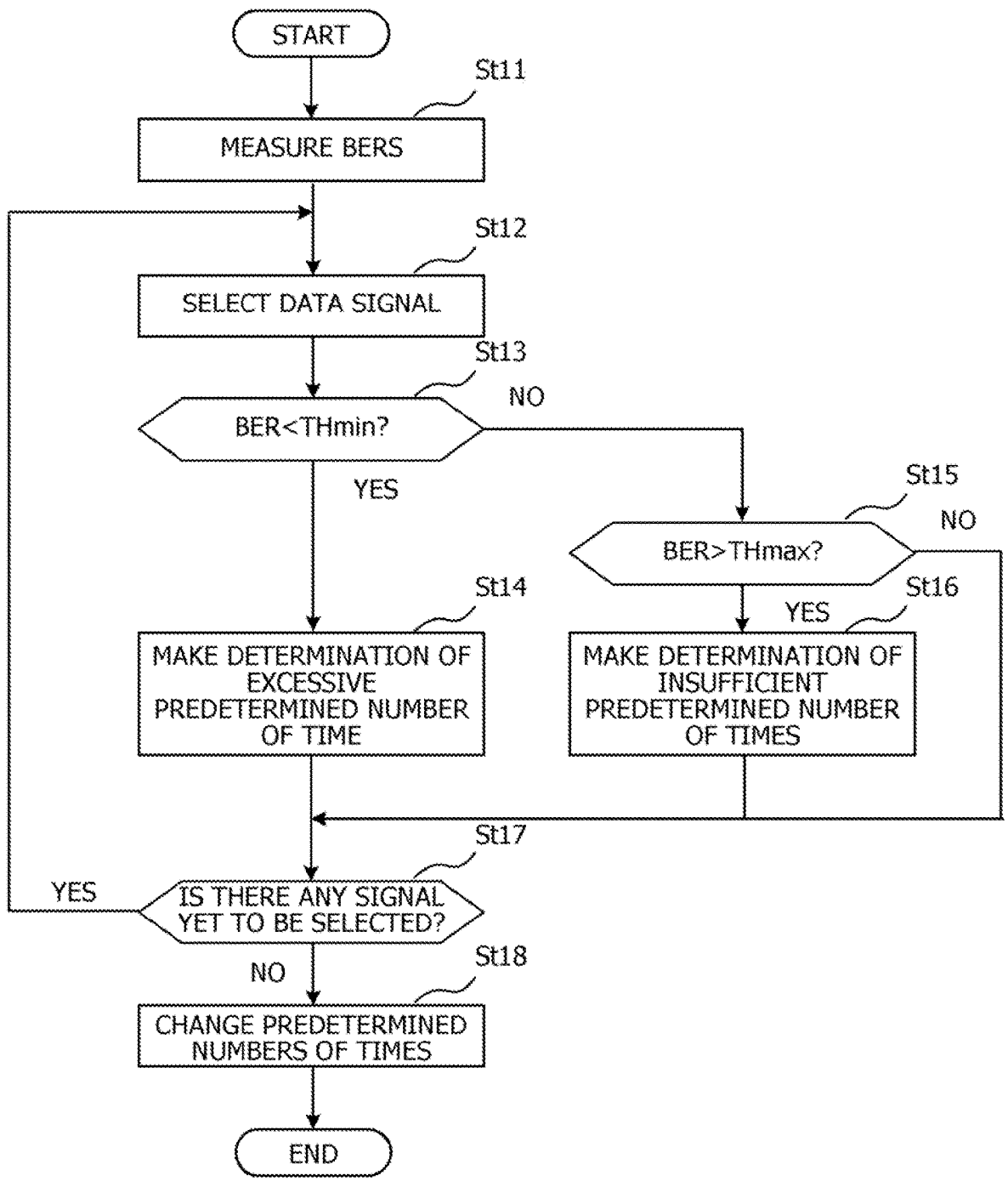
FIG. 8 is a flowchart illustrating a process of changing predetermined numbers of times in the second embodiment.

FIG. 8 is a flowchart illustrating a process of changing the predetermined numbers of times Na to Nc in the second embodiment. The BER monitor circuit 128*a* measures a BER on the basis of the data of each of the data signals Sa to Sc input from the error correction circuit 123 (step St11). The BER monitor circuit 128*a* notifies the iteration control circuit 127*a* of the BER of each of the data signals Sa to Sc.

Next, the iteration control circuit 127*a* selects one of the data signals Sa to Sc for which determination regarding the BER is to be made (step St12). The iteration control circuit 127*a* compares the BER of the selected one of the data signals Sa to Sc with a predetermined lower limit value THmin (step St13). Note that the lower limit value THmin is determined in advance according to, for example, transmission conditions for each of the data signals Sa to Sc.

When the BER is less than the lower limit value THmin (Yes in step St13), the iteration control circuit 127*a* determines that one of the predetermined numbers of times Na to Nc corresponding to the selected one of the data signals Sa to Sc exceeds a number of times matching the error correction capability of the error correction circuit 123 (hereinafter referred to as "determination of an excessive predetermined number of times") (step St14).

Furthermore, when the BER is equal to or greater than the lower limit value THmin (No in step St13), the iteration control circuit 127*a* compares the BER of the selected one of the data signals Sa to Sc with a predetermined upper limit value THmax (step St15). Note that the upper limit value THmax is greater than the lower limit value THmin, and is determined in advance according to, for example, the transmission conditions for each of the data signals Sa to Sc.

When the BER is greater than the upper limit value THmax (Yes in step St15), the iteration control circuit 127*a* determines that one of the predetermined numbers of times Na to Nc corresponding to the selected one of the data signals Sa to Sc is less than the number of times matching the error correction capability of the error correction circuit 123 (hereinafter referred to as "determination of an insufficient predetermined number of times") (step St16). Furthermore, when the BER is equal to or less than the upper limit value THmax (No in step St15), the iteration control circuit 127*a* performs a process of step St17.

Next, the iteration control circuit 127*a* determines whether any of the data signals Sa to Sc is yet to be selected (step St17). When any of the data signals Sa to Sc is yet to be selected (Yes in step St17), the processes of step St12 and the subsequent steps are performed again. In this case, one of the data signals Sa to Sc yet to be selected is selected in the process of step St12.

Furthermore, when none of the data signals Sa to Sc remains yet to be selected (No in step St17), the iteration control circuit 127*a* changes the respective predetermined numbers of times Na to Nc for the data signals Sa to Sc based on respective determination results of "determination of an excessive predetermined number of times" or "determination of an insufficient predetermined number of times" for the data signals Sa to Sc (step St18). The iteration control circuit 127*a* reduces the predetermined number of times Na, Nb, or Nc corresponding to any of the data signals Sa to Sc for which the "determination of an excessive predetermined number of times" has been made, and adds a number of times corresponding to the reduction to the predetermined number of times Na, Nb, or Nc corresponding to another of the data signals Sa to Sc for which the "determination of an insufficient predetermined number of times" has been made.

As a result, the iteration control circuit 127a can appropriately adjust the predetermined numbers of times Na to Nc among the data signals Sa to Sc based on BERs such that the sum of the predetermined numbers of times Na to Nc does not exceed an upper limit number of times Nmax.

For example, even if the respective predetermined numbers of times Na to Nc for the data signals Sa to Sc are uniformly set to 3 as illustrated in FIG. 3, the iteration control circuit 127a can set the predetermined numbers of times Na to Nc based on the respective BERs of the data signals Sa to Sc such that the predetermined number of times Nb for the data signal Sb is greater than the predetermined numbers of times Na and Nc for the other data signals, that is, the data signals Sa and Sc as illustrated in, for example, FIG. 6. This means that the iteration control circuit 127a has made the "determination of an insufficient predetermined number of times" for the data signal Sb and the "determination of an excessive predetermined number of times" for the data signals Sa and Sc.

In the present example, a BER has been cited as an index value indicating the quality of each of the data signals Sa to Sc, but an optical signal-to-noise ratio (OSNR) may be used as in the following example.

Third Embodiment

Figure 9:
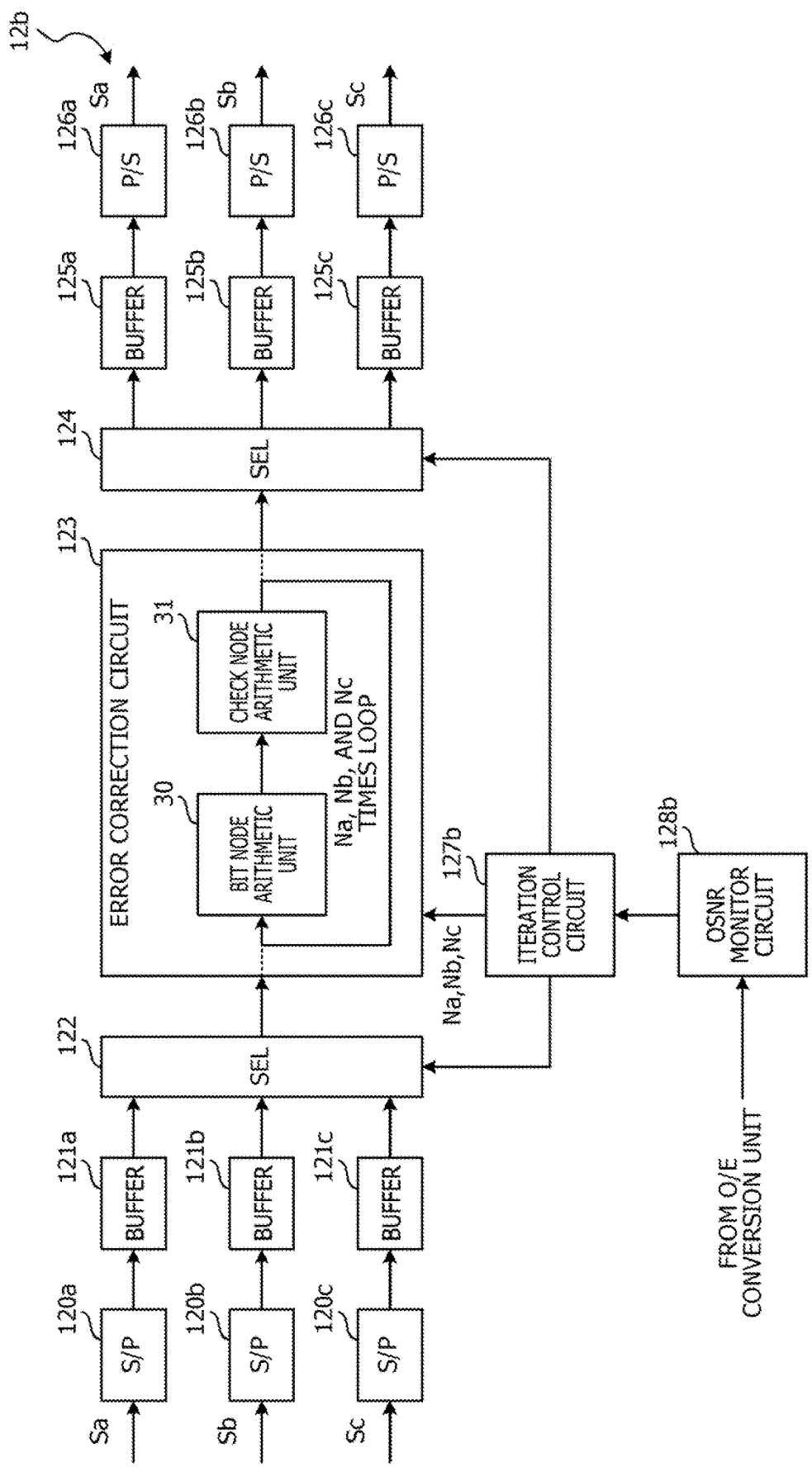
FIG. 9 is a configuration diagram illustrating a decoding circuit of a third embodiment.

FIG. 9 is a configuration diagram illustrating a decoding circuit 12b of a third embodiment. In FIG. 9, the same elements as those in FIG. 2 are denoted by the same reference numerals, and description thereof will be omitted. The decoding circuit 12b is provided in a receiving apparatus 1 instead of the decoding circuit 12 of the first embodiment. The decoding circuit 12b includes an iteration control circuit 127b instead of the iteration control circuit 127, and further includes an optical signal-to-noise ratio (OSNR) monitor circuit 128b.

The OSNR monitor circuit 128b measures the OSNR of each of data signals Sa to Sc on the basis of a signal input from an optical/electrical (OLE) conversion unit 10. The OSNR monitor circuit 128b notifies the iteration control circuit 127b of the OSNR of each of the data signals Sa to Sc. Note that the OSNR monitor circuit 128b is an example of a measuring unit that measures the quality of each of the data signals Sa to Sc. Furthermore, the OSNR is an example of an index value of the quality of each of the data signals Sa to Sc.

The iteration control circuit 127b compares the OSNR with a predetermined upper limit value and lower limit value for each of the data signals Sa to Sc, and changes respective predetermined numbers of times Na to Nc for the data signals Sa to Sc based on comparison results. For example, when the OSNR of any of the data signals Sa to Sc exceeds the upper limit value, the iteration control circuit 127b reduces corresponding one of the predetermined numbers of times Na to Nc because the error correction capability of the error correction circuit 123 is excessive. Furthermore, when the OSNR of any of the data signals Sa to Sc is below the lower limit value, the iteration control circuit 127b increases corresponding one of the predetermined numbers of times Na to Nc because the error correction capability of the error correction circuit 123 is insufficient.

Figure 10:
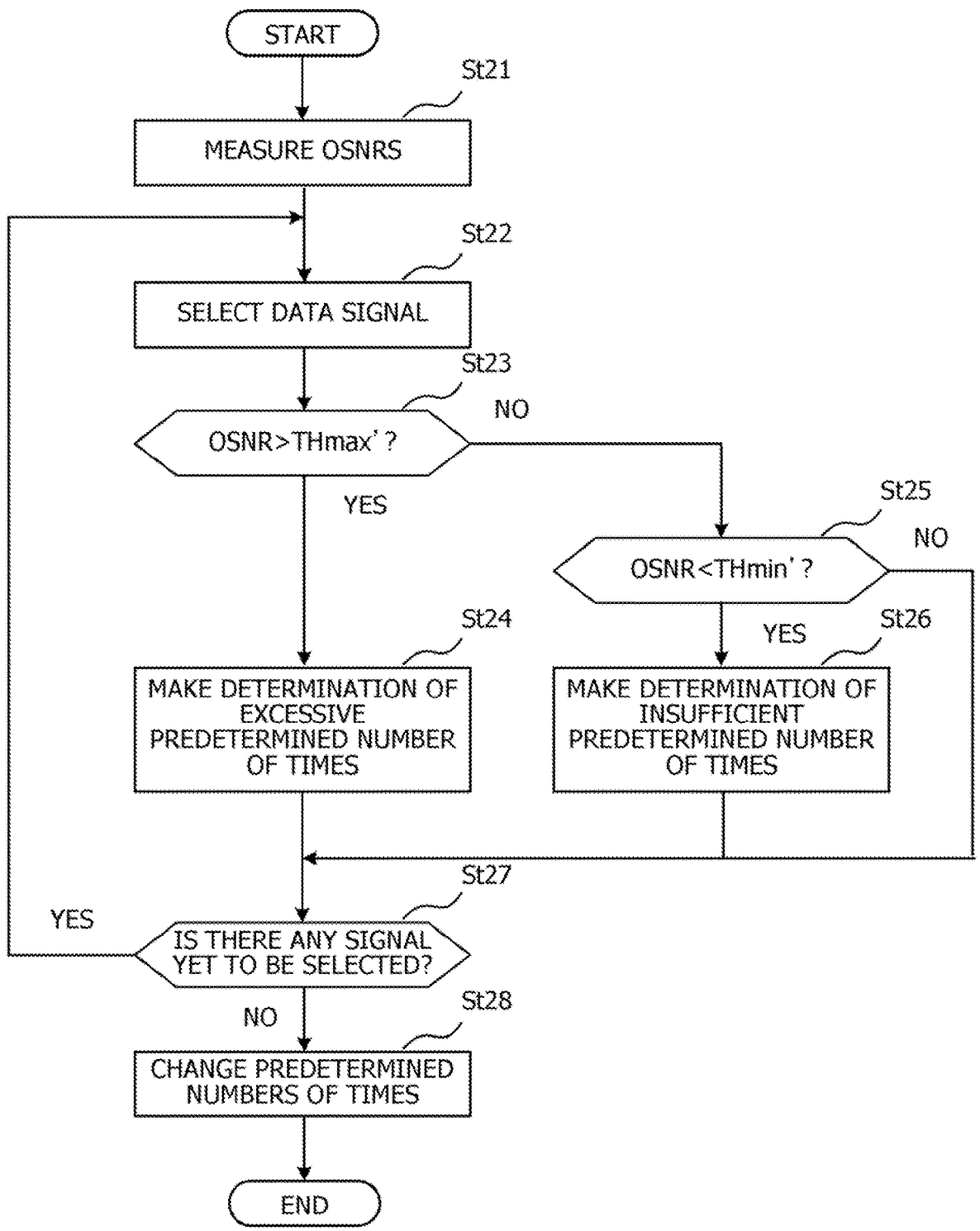
FIG. 10 is a flowchart illustrating a process of changing predetermined numbers of times in the third embodiment.

FIG. 10 is a flowchart illustrating a process of changing the predetermined numbers of times Na to Nc in the third embodiment. The OSNR monitor circuit 128b measures the OSNR of each of data signals Sa to Sc on the basis of a signal input from the O/E conversion unit 10 (step St21). The OSNR monitor circuit 128b notifies the iteration control circuit 127b of the OSNR of each of the data signals Sa to Sc.

Next, the iteration control circuit 127b selects one of the data signals Sa to Sc for which determination regarding the OSNR is to be made (step St22). The iteration control circuit 127b compares the OSNR of the selected one of the data signals Sa to Sc with a predetermined upper limit value THmax' (step St23). Note that the upper limit value THmax' is determined in advance according to, for example, transmission conditions for each of the data signals Sa to Sc.

When the OSNR is greater than the upper limit value THmax' (Yes in step St23), the iteration control circuit 127b makes a "determination of an excessive predetermined number of times" for the selected one of the data signals Sa to Sc (step St24).

Furthermore, when the OSNR is equal to or less than the upper limit value THmax' (No in step St23), the iteration control circuit 127b compares the OSNR of the selected one of the data signals Sa to Sc with a predetermined lower limit value THmin' (step St25). Note that the lower limit value THmin' is less than the upper limit value THmax', and is determined in advance according to, for example, the transmission conditions for each of the data signals Sa to Sc.

When the OSNR is less than the lower limit value THmin' (Yes in step St25), the iteration control circuit 127b makes a "determination of an insufficient predetermined number of times" for the selected one of the data signals Sa to Sc (step St26). Furthermore, when the OSNR is equal to or greater than the lower limit value THmin' (No in step St25), the iteration control circuit 127a performs a process of step St27.

Next, the iteration control circuit 127b determines whether any of the data signals Sa to Sc is yet to be selected (step St27). When any of the data signals Sa to Sc is yet to be selected (Yes in step St27), the processes of step St22 and the subsequent steps are performed again. In this case, one of the data signals Sa to Sc yet to be selected is selected in the process of step St22.

Furthermore, when none of the data signals Sa to Sc remains yet to be selected (No in step St27), the iteration control circuit 127b changes the respective predetermined numbers of times Na to Nc for the data signals Sa to Sc based on respective determination results of "determination of an excessive predetermined number of times" or "determination of an insufficient predetermined number of times" for the data signals Sa to Sc (step St28). The iteration control circuit 127b reduces the predetermined number of times Na, Nb, or Nc corresponding to any of the data signals Sa to Sc for which the "determination of an excessive predetermined number of times" has been made, and adds a number of times corresponding to the reduction to the predetermined number of times Na, Nb, or Nc corresponding to another of the data signals Sa to Sc for which the "determination of an insufficient predetermined number of times" has been made.

As a result, the iteration control circuit 127b can appropriately adjust the predetermined numbers of times Na to Nc among the data signals Sa to Sc based on OSNRs such that the sum of the predetermined numbers of times Na to Nc does not exceed an upper limit number of times Nmax, as in the second embodiment. Note that a bit error rate (BER) and an OSNR have been respectively cited as preferable examples of an index value indicating quality in the second and third embodiments, but the index value is not limited thereto, and other index values may be used.

Fourth Embodiment

Figure 11:
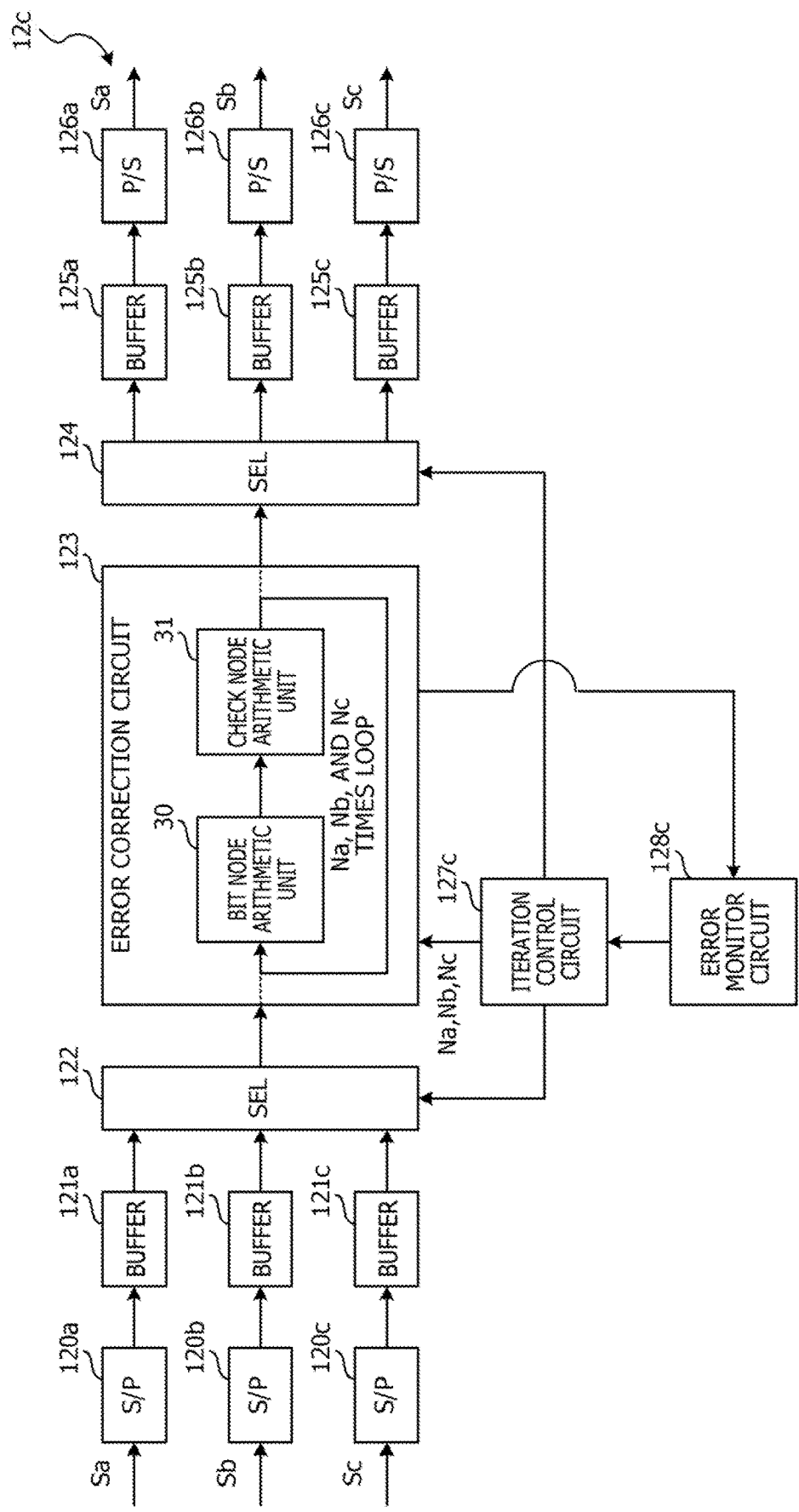
FIG. 11 is a configuration diagram illustrating a decoding circuit of a fourth embodiment.

FIG. 11 is a configuration diagram illustrating a decoding circuit 12c of a fourth embodiment. In FIG. 11, the same elements as those in FIG. 2 are denoted by the same reference numerals, and description thereof will be omitted. The decoding circuit 12c is provided in a receiving apparatus 1 instead of the decoding circuit 12 of the first embodiment. The decoding circuit 12c includes an iteration control circuit 127c instead of the iteration control circuit 127, and further includes an error monitor circuit 128c.

The error monitor circuit 128c acquires respective data of error-corrected data signals Sa to Sc from an error correction circuit 123, and measures the number of errors that could not be corrected by soft-decision forward error correction (SD-FEC). The error monitor circuit 128c notifies the iteration control circuit 127c of the number of errors in each of the data signals Sa to Sc. Note that the error monitor circuit 128c is an example of a measuring unit that measures the quality of each of the data signals Sa to Sc.

The iteration control circuit 127c adds, to respective predetermined numbers of times Na to Nc of the data signals Sa to Sc, a number of times Nr (=Nmax−(Na+Nb+Nc)) obtained as a remainder after subtraction of the sum (Na+Nb+Nc) of the respective predetermined numbers of times Na to Nc of the data signals Sa to Sc from an upper limit number of times Nmax, based on the number of errors measured by the error monitor circuit 128c. Therefore, the receiving apparatus 1 can improve the quality of the data signals Sa to Sc by using the remainder of the predetermined numbers of times Na to Nc.

Figure 12:
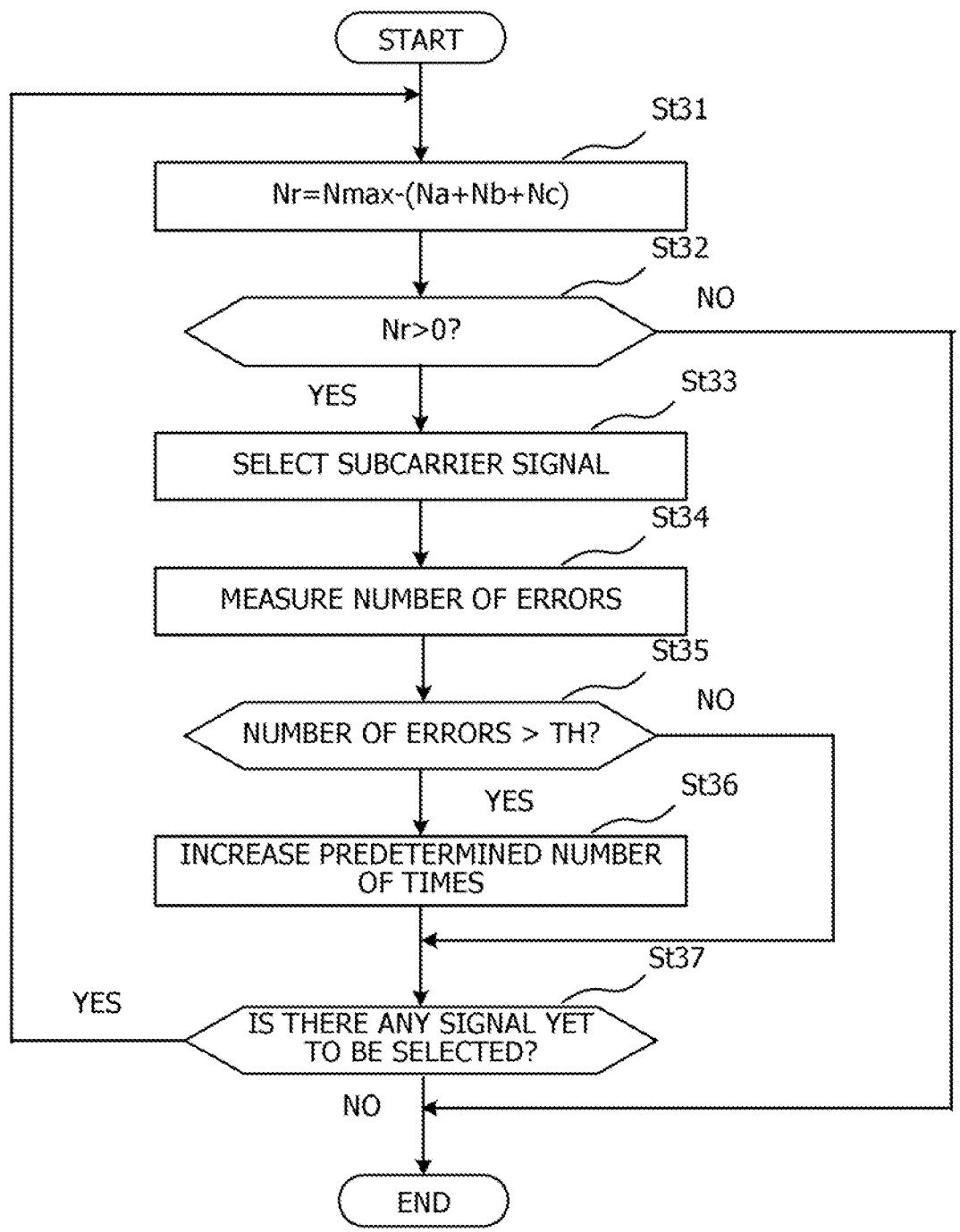
FIG. 12 is a flowchart illustrating a process of changing predetermined numbers of times in the fourth embodiment.

FIG. 12 is a flowchart illustrating a process of changing the predetermined numbers of times Na to Nc in the fourth embodiment. The iteration control circuit 127c calculates the number of times Nr that is a remainder after subtraction of the sum of the respective predetermined numbers of times Na to Nc for the data signals Sa to Sc from the upper limit number of times Nmax (step St31).

Next, the iteration control circuit 127c determines whether the number of times Nr obtained as a remainder is greater than 0 (step St32). For example, the iteration control circuit 127c determines whether there is an excess of the upper limit number of times Nmax over the sum of the predetermined numbers of times Na to Nc. When the number of times Nr obtained as a remainder is 0 or less (No in step St32), the process ends.

Next, the iteration control circuit 127c selects one of the data signals Sa to Sc for which determination regarding the number of errors is to be made (step St33). Then, the error monitor circuit 128c measures the number of errors in the selected one of the data signals Sa to Sc (step St34). The error monitor circuit 128c notifies the iteration control circuit 127c of the number of errors.

Next, the iteration control circuit 127c compares the number of errors with a threshold value TH (step St35). Note that the threshold value TH is determined in advance according to, for example, transmission conditions for each of the data signals Sa to Sc.

When the number of errors is greater than the threshold value TH (Yes in step St35), the iteration control circuit 127c increases one of the predetermined numbers of times Na to Nc corresponding to the selected one of the data signals Sa to Sc by 1 (step St36). Furthermore, when the number of errors is equal to or less than the threshold value TH (No in step St35), the iteration control circuit 127c makes no change to the one of the predetermined numbers of times Na to Nc corresponding to the selected one of the data signals Sa to Sc, and maintains the one of the predetermined numbers of times Na to Nc at the initially set number.

Next, the iteration control circuit 127c determines whether any of the data signals Sa to Sc is yet to be selected (step St37). When any of the data signals Sa to Sc is yet to be selected (Yes in step St37), the processes of step St31 and the subsequent steps are performed again. In this case, one of the data signals Sa to Sc yet to be selected is selected in the process of step St33. Furthermore, when none of the data signals Sa to Sc remains yet to be selected (No in step St37), the process ends.

Thus, the iteration control circuit 127c adds, to the respective predetermined numbers of times Na to Nc for the data signals Sa to Sc, the number of times Nr obtained as a remainder after subtraction of the sum of the respective predetermined numbers of times Na to Nc for the data signals Sa to Sc from the upper limit number of times Nmax, based on the number of errors measured by the error monitor circuit 128c. For example, when the respective predetermined numbers of times Na to Nc for each of the data signals Sa to Sc are set to 2, the number of times Nr obtained as a remainder is 3 (=9−(2+2+2)). At this time, arithmetic processing is not performed for three clocks during the time period T in FIG. 3.

In this case, when only the number of errors in the data signal Sb exceeds the threshold value TH, the iteration control circuit 127c increases the predetermined number of times Nb. At this time, the iteration control circuit 127c adds the entire number of times Nr (=3) obtained as a remainder to the predetermined number of times Nb so that the number of errors in the data signal Sb is equal to or less than the threshold value TH. As a result, the predetermined number of times Nb for the data signal Sb is set to 5 as illustrated in FIG. 6. Therefore, the receiving apparatus 1 can improve the quality of the data signals Sa to Sc by using the remainder of the predetermined numbers of times Na to Nc.

In this way, the iteration control circuits 127a and 127b change the respective predetermined numbers of times Na to Nc for the data signals Sa to Sc based on BERs and OSNRs measured by the BER monitor circuit 128a and the OSNR monitor circuit 128b, respectively, such that the sum of the respective predetermined numbers of times Na to Nc for the data signals Sa to Sc does not exceed the upper limit number of times Nmax.

Thus, the receiving apparatus 1 can perform arithmetic processing the predetermined numbers of times Na to Nc that are appropriate numbers determined according to the respective qualities of the data signals Sa to Sc, so that power to be consumed in the decoding process can be more effectively reduced. Note that after the initial settings are made by the network management apparatus 9, the predetermined numbers of times Na to Nc may be increased if there is a remainder after subtraction of the predetermined numbers of times Na to Nc from the upper limit number of times Nmax, as in the above example.

The embodiments described above are preferred examples. However, the embodiments are not limited to these examples, and a variety of modifications may be made without departing from the scope of the embodiments.

In addition, the following claims are disclosed with respect to the above description.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. A receiving apparatus comprising:
   a receiving circuit configured to receive a plurality of subcarrier signals each including encoded data;
   a plurality of acquisition circuits, each of the plurality of acquisition being configured to acquire a predetermined amount of data from corresponding one of the plurality of subcarrier signals;
   an error correction circuit configured to correct errors in the plurality of subcarrier signals by iteratively performing decoding arithmetic processing on the respective predetermined amounts of data acquired by the plurality of acquisition circuits in a time-division manner;
   a control circuit configured to cause the error correction circuit to consecutively perform the decoding arithmetic processing on each of the predetermined amounts of data a predetermined number of times, the predetermined number of times being a number of iterations determined based on at least either a modulation method or a transmission distance of corresponding one of the plurality of subcarrier signals; and
   a measuring circuit configured to measure respective qualities of the plurality of subcarrier signals,
   the control circuit is configured to change the respective predetermined numbers of times for the plurality of subcarrier signals, based on the qualities measured by the measuring circuit such that a sum of the respective predetermined numbers of times for the plurality of subcarrier signals does not exceed an upper limit number of times,
   the control circuit adds a number of times to the respective predetermined numbers of times for the plurality of subcarrier signals, based on the qualities measured by the measuring circuit, the number of times corresponding to a remainder after subtraction of the sum of the respective predetermined numbers of times for the plurality of subcarrier signals from the upper limit number of times.

2. The receiving apparatus according to claim 1, further comprising:
   a selection circuit configured to select the predetermined amount of data to be subjected to the decoding arithmetic processing from among the respective predetermined amounts of data acquired by the plurality of acquisition circuits, wherein
   the control circuit is configured to switch selections made by the selection circuit according to time to be taken to perform the decoding arithmetic processing the predetermined number of times.

3. The receiving apparatus according to claim 1, wherein, among the plurality of subcarrier signals, the control circuit reduces the predetermined number of times for subcarrier signals in which a quality-related index value exceeds an upper limit value, and adds a number of times corresponding to the reduction to the predetermined number of times for subcarrier signals in which the quality-related index value is below a lower limit value.

4. The receiving apparatus according to claim 3, wherein the quality-related index value is an optical signal-to-noise ratio (OSNR).

5. The receiving apparatus according to claim 1, wherein, among the plurality of subcarrier signals, the control unit reduces the predetermined number of times for subcarrier signals in which a quality-related index value is below a lower limit value, and adds a number of times corresponding to the reduction to the predetermined number of times for subcarrier signals in which the quality-related index value exceeds an upper limit value.

6. The receiving apparatus according to claim 5, wherein the quality-related index value is a bit error rate (BER).

7. The receiving apparatus according to claim 1, wherein the error correction circuit acquires, from another device, the predetermined numbers of times each determined based on at least either a modulation method or a transmission distance of corresponding one of the plurality of subcarrier signals.

8. A decoding method comprising:
   receiving a plurality of subcarrier signals each including encoded data;
   acquiring a predetermined amount of data from each of the plurality of subcarrier signals;
   correcting errors in the plurality of subcarrier signals by iteratively performing decoding arithmetic processing on the respective predetermined amounts of data acquired from the plurality of subcarrier signals in a time-division manner;
   causing the decoding arithmetic processing to be consecutively performed on each of the predetermined amounts of data a predetermined number of times, the predetermined number of times being a number of iterations determined based on at least either a modulation method or a transmission distance of corresponding one of the plurality of subcarrier signals; and
   measuring respective qualities of the plurality of subcarrier signals,
   the respective predetermined numbers of times for the plurality of subcarrier signals are changed based on the measured qualities such that a sum of the respective predetermined numbers of times for the plurality of subcarrier signals does not exceed an upper limit number of times,
   a number of times is added to the respective predetermined numbers of times for the plurality of subcarrier signals, based on the measured qualities, the number of times corresponding to a remainder after subtraction of the sum of the respective predetermined numbers of times for the plurality of subcarrier signals from the upper limit number of times.

9. The decoding method according to claim 8, further comprising:
   selecting the predetermined amount of data to be subjected to the decoding arithmetic processing from among the respective predetermined amounts of data acquired from the plurality of subcarrier signals, wherein
   selections of the predetermined amount of data are switched according to time to be taken to perform the decoding arithmetic processing the predetermined number of times.

10. The decoding method according to claim 8, wherein, among the plurality of subcarrier signals, the predetermined number of times for subcarrier signals in which a quality-related index value exceeds an upper limit value is reduced, and a number of times corresponding to the reduction is added to the predetermined number of times for subcarrier signals in which the quality-related index value is below a lower limit value.

11. The decoding method according to claim 10, wherein the quality-related index value is an OSNR.

12. The decoding method according to claim 11, wherein, among the plurality of subcarrier signals, the predetermined number of times for subcarrier signals in which a quality-related index value is below a lower limit value is reduced, and a number of times corresponding to the reduction is added to the predetermined number of times for subcarrier signals in which the quality-related index value exceeds an upper limit value.

13. The decoding method according to claim 12, wherein the quality-related index value is a BER.

14. The decoding method according to claim 8, wherein the predetermined numbers of times each determined based on at least either a modulation method or a transmission distance of corresponding one of the plurality of subcarrier signals are acquired from another device.

\* \* \* \* \*